June 20, 1961 T. B. HORGAN 2,989,628

TRANSISTORIZED DETECTOR AND AUDIO AMPLIFIER SYSTEM

Filed Jan. 23, 1957

INVENTOR.
THOMAS B. HORGAN.
BY Alden D. Redfield
Irwin P. Garfinkle
ATTORNEYS.

United States Patent Office 2,989,628
Patented June 20, 1961

2,989,628

TRANSISTORIZED DETECTOR AND AUDIO AMPLIFIER SYSTEM

Thomas B. Horgan, Cincinnati, Ohio, assignor to Avco Manufacturing Corporation, Cincinnati, Ohio, a corporation of Delaware Filed Jan. 23, 1957, Ser. No. 635,623
3 Claims. (Cl. 250—20)

This invention relates to a transistorized receiver system and, more particularly, to the detector and audio frequency amplifying stages of a transistorized receiver.

In general, the system disclosed includes a diode detector circuit which achieves high efficiency demodulation while maintaining high modulation-handling capabilities. The system also provides a very stable, self-adjusting transistor driver stage having flat gain response in the audio frequency range and a distortion-free, push-pull class B audio frequency amplifier. This invention provides audio amplification with sufficient gain, fidelity and quality for use as the audio output stages in the various types of commercial receivers, and it uses component parts with practical commercial tolerances. The invention also provides good practical operating stability with respect to variations in temperature and bias supply voltage, and means are incorporated for controlling the frequency-gain characteristics to provide desirable frequency response in the normal A.-F. range.

It is one of the objects of this invention to provide a transistorized receiver system having a diode detector circuit which achieves high efficiency demodulation while maintaining high modulation percentage capabilities.

It is another object of this invention to provide a transistor receiver system having a diode detector circuit which includes a volume-controlled audio frequency output and which incorporates an automatic gain control power source.

Another object of this invention is to provide a detector circuit which is particularly adapted to use in transistor receivers and which will maintain demodulation efficiency and percentage of modulation-handling capability uniform with changes in volume control and/or varying automatic gain control power demand.

Another object of this invention is to reduce low-level distortion normally associated with diode detectors used in transistorized receivers.

Still another object of this invention is to provide an aperiodic, stable, self-adjusting audio frequency amplifier having a flat gain response.

Another object is to provide an amplifier and detector system which provides means for boosting the low frequency gain to compensate for fall-off due to speaker and cabinet limitations, and to provide frequency compensation with volume level.

Another object of this invention is to provide a detector and audio amplifier system having highly efficient operation with commercial transistors and associated components, and having circuit simplicity and economy of parts.

For a more complete understanding of the invention, reference should now be made to the drawings, in which.

Figures 1, 2, 3:
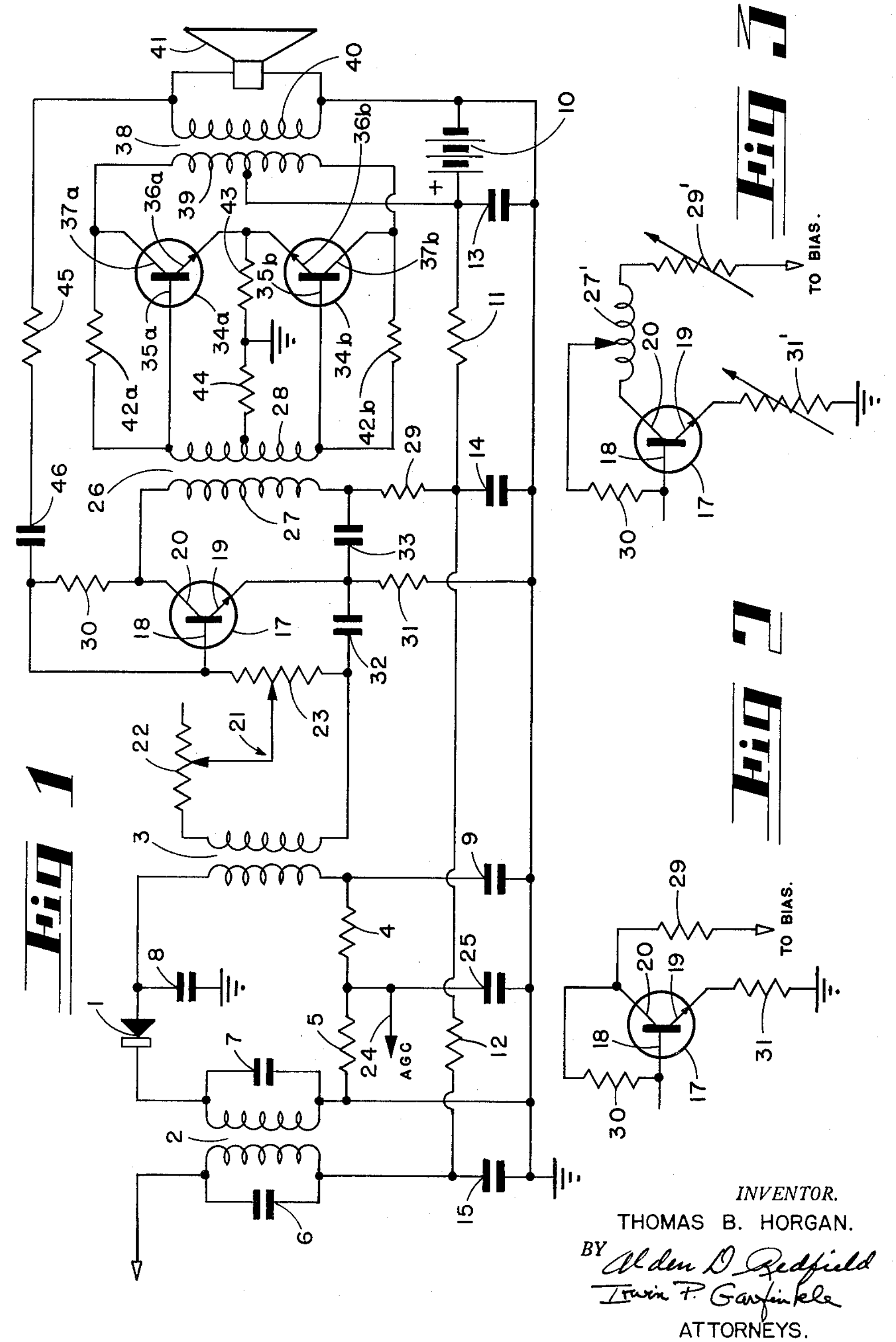
FIGURE 1 is a schematic representation of a preferred form of the invention.
FIGURE 2 is a simplified representation of the aperiodic amplifier used in the driver stage of FIGURE 1.
FIGURE 3 is a modification in simplified form of the aperiodic amplifier illustrated in FIGURES 1 and 2.

The circuit illustrated in FIGURE 1 includes the detector, driver and class B audio frequency amplifier stages of a transistorized broadcast receiver. The detector stage includes a diode rectifier 1 connected in circuit with an intermediate frequency transformer 2, an audio frequency coupling transformer 3 and resistors 4 and 5. The I.F. transformer 2 may be coupled to the output of a conventional intermediate frequency amplifier (not shown) and is tuned to the intermediate frequency by means of condensers 6 and 7. The audio coupling transformer 3 is untuned, the condenser 8 being employed to by-pass unwanted I.F. signals and harmonics to ground. Resistors 4 and 5, connected in series with the primary of transformer 3, constitute the D.C. load for the diode 1, while the primary winding of transformer 3 constitutes the A.C. load. A condenser 9, connected in series with the primary of transformer 3, is provided to by-pass A.C. signals from the D.C. load resistors 4 and 5. Since the by-pass condenser 9 is series-connected with the primary winding of transformer 3, it may be adjusted to give bass boost to the frequency response by series resonance at the desired low frequencies. The intermediate frequency stage is D.C. biased from a battery 10 through resistors 11 and 12, while the by-pass condensers 13, 14 and 15 prevent A.C. signals from entering the biasing circuit.

Because the input of the detector stage is applied from the tuned secondary of the intermediate frequency transformer 2, the resonant impedance of this circuit is sufficiently high to operate the diode 1 at a level of maximum efficiency. Moreover, the primary of the audio frequency transformer 3 also presents a high impedance load to the diode 1 as required. In order to maintain high modulation-handling capabilities of the detector, the D.C. load resistors 4 and 5 are selected to match the A.C. impedance value. The A.C.–D.C. impedance ratio is thereby adjusted to approximate unity, and deviation from this value is avoided since any deviation, either up or down, will decrease the modulating-handling capability of the system. Since the A.C. output from the detector is applied from the secondary of the coupling transformer 3 to the transistor amplifier 17 provided with a base 18, an emitter 19 and a collector 20, and because the input impedance of the transistor amplifier 17 is usually low (typically 500 to 1,000 ohms), special volume control circuitry having a high resistance value compared to the transistor input impedance is required, and the dual potentiometer 21 having resistance elements 22 and 23 is connected in circuit with transistor amplifier 17. In the operation of the system, it is required that the resistance element 23 be reasonably large as compared with the input of transistor 17. In the full volume position (the arms of potentiometer 21 turned counter-clockwise), the load on the secondary winding of transformer 3 is equal to the input load of transistor 17. As the potentiometer arms are moved clockwise to reduce volume, there is a slight unloading at middle volume ranges. At low volume, however, there would be very heavy loading but for the resistor element 22 which is simultaneously inserted into the transistor input circuit. The resistor 22, operating in conjunction with the resistor 23, prevents the change in loading of transformer 3 which would otherwise be reflected in the detector and upset the A.C./D.C. impedance ratio.

A source 24 of automatic gain control voltage is available in the detector circuit at the junction of the D.C. load resistors 4 and 5. Automatic gain control for transistors requires a considerable amount of power, and the more gain control power used, the small will the D.C. resistance appear to the detector, and this will unbalance the A.C./D.C. impedance ratio. Therefore, the automatic gain control source in the detector circuit creates the problem of maintaining the D.C. load of the detector constant during periods of AGC loading. To accomplish this, the AGC source is derived from the junction of resistors 4 and 5, the ratio of which is such that the junction is at about thirty-five percent of full D.C. voltage from ground and the AGC power is derived from this point. In this way, sufficient power is available for automatic gain control and, at the same time, the effects of AGC loading are minimized.

The AGC line is provided with a non-polarized shunt capacitor 25 which is selected to give the desired control time constant. In the arrangement shown, the detector system provides a negative-going control voltage which may be applied to the previous high frequency stages, reducing a normally positive voltage on a transistor element; for example, the control voltage may be applied to the base of a grounded-emitter NPN transistor I.F. amplifier. Considering the operation of the detector system under no signal and very low signal levels, it may be seen that a small positive voltage is fed back from the controlled element to the automatic gain control points between the D.C. load resistors 4 and 5. This voltage is of the proper polarity to bias the diode 1 into conduction and greatly reduces the low level detection distortion normally found in diodes.

The transistor amplifier 17 of the driver stage is self-biased and is connected for common emitter operation, i.e., the emitter 19 is common to the driver input circuit, which includes the base element 18, and to the driver output circuit, which includes the collector element 20. The resistor elements 22 and 23 of the dual potentiometer 21 are connected across the secondary of the transformer 3 and are in circuit with the base and emitter electrodes of the transistor 17. The audio frequency output circuit of the driver includes a transformer 26 having a primary winding 27 in circuit with the collector 20 and a secondary winding 28, while the resistor 29 connected between the primary winding 27 and the resistor 11 in the biasing network comprises the D.C. load circuit of the driver stage. A feedback resistor 30 is connected from the output circuit at the collector 20 to the input circuit at the base 18. The emitter 19 is connected to ground through an emitter-resistor 31, but the D.C. circuits of the base 18 and the collector 20 are isolated from ground by means of D.C. blocking condensers 32 and 33. The driver stage is biased by means of the battery 10 through the decoupling or filter resistor 11.

The operation and advantages of the driver stage may be seen by reference to the simplified schematic of FIGURE 2 in which the D.C. paths of FIGURE 1 have been illustrated. As is well known to those skilled in the art, thermal runaway is a major transistor problem. It is known that the conductivity of a transistor will increase with a rise in temperature. For the same applied voltage, an increase in thermal energy will cause greater current flow in both the input and output circuits. This, in turn, will reduce control of the collector circuit by the emitter, and it is even possible for the thermal action to perpetuate itself, eventually destroying the transistor, e.g., the higher temperature results in more current, more current raises the temperature still higher, which results in more current, and so on. If permitted to go unchecked by means of proper degenerative arrangements, this condition will cause transistor burnout, particularly if the transistor is operated near its maximum dissipation limit.

It may be seen in FIGURE 2 that the resistors 29 and 31 constitute the D.C. collector and emitter loads, respectively, while resistor 30 constitutes a feedback path from the collector 20 to the base 18 for providing base bias. It is noted that there is no D.C. path to ground from the base or collector elements except through the emitter 19 and resistor 31. Thus, in the event of a temperature rise, when collector reverse current is increased and the transistor tends towards thermal runaway, the increased current from collector to emitter causes the voltage at the collector 20 to go down and the voltage across emitter-resistor 31 to go up. Therefore, the voltage at the collector 20 will approach the voltage at the emitter 19, and reduced collector-emitter voltage will reduce transistor dissipation. Moreover, since resistor 30 is connected from the collector to the base, a reduction in collector voltage will cause a reduction in the voltage across resistor 30 and hence, a reduction in the bias of the base 18. Since the emitter bias is increased and the base bias decreased, this results in a reduction of transistor current flow. Thus, in the event of increased collector currents resulting from a temperature rise, the transistor 17 is made temperature-stable by simultaneously and automatically decreasing the collector-emitter and the base-emitter biases.

In addition to temperature stability, this driver stage also provides several sources of bass boost. For example, the blocking condensers 32 and 33 which are connected to the top of resistor 31 provide frequency-dependent feedback. Since the high frequencies are attenuated more than the low, one source of bass boost is gained. Also, because of the wiring capacities and because of the condenser 9, an A.C. ground reference exists on the secondary side of the transformer 3. Thus, at lower frequencies, the input impedance of transistor 17 is increased, producing another source of bass boost. A further bass boosting effect is achieved, dependent on the volume setting of the dual potentiometer 21. At middle and low volume, the input circuit to the transistor 17 is unloaded somewhat, as compared with full volume. This unloading improves the circuit Q, and the enhancement of the resonance of the primary winding of transformer 3 causes a greater bass boosting.

For the purpose of providing variable D.C. stability and variable A.C. feedback, the driver stage may be modified as shown in the simplified illustration of FIGURE 3 where a variable tap transformer primary 27' has been substituted for primary winding 27, and variable resistors 29' and 31' replace the fixed resistors 29 and 30. Varying resistor 29' and/or resistor 31' adjusts D.C. stability. Varying the tap on the primary winding 27' adjusts the A.C. feedback from the collector 20 to base 19. Base bias is determined in both FIGURE 1 and FIGURE 3 by suitable selection of the feedback resistor 30.

A push-pull class B transistor amplifier follows the driver stage. The alternating current load output of the driver is coupled to the class B amplifier through the transformer 26, and is applied to the transistors **34*a* and 34*b* which are connected in push-pull relationship. Each transistor comprises, respectively, a base 35*a*, 35*b*, an emitter 36*a*, 36*b* and a collector 37*a*, 37*b*. The input from the transformer 26 is applied alternately from opposite ends of the secondary winding 28 to the bases 35*a* and 35*b*, while the class B output is applied alternately from the collectors 36*a* and 36*b* to the opposite ends of primary winding 39 of transformer 38 to drive a suitable speaker 41 connected across the transformer secondary 40. The class B stage is suitably biased by the battery 10 connected to the center tap of the transformer primary 39**.

For controlling and stabilizing the class B amplifier, negative feedback resistors **42*a* and 42*b* are connected, respectively, from the collectors 37*a* and 37*b* to the bases 35*a* and 35*b*. In addition, a resistor 43 is connected from the junction between the emitters to ground, and a resistor 44 is connected from the center tap of the transfer secondary 28 to ground. An over-all feedback path between the class B amplifier and the driver is provided by means of the resistor 45 and condenser 46 connected between the speaker 41 and the driver stage input circuit at the base 18 of the transistor 17. This feedback loop serves to provide a wide control range of the gain-frequency characteristics, stability and distortion reduction, particularly that occurring at frequencies outside the normal audible range, and is designed to handle a very wide frequency band relative to the audible response. The resistor 45** and the condenser 46 may be selected to give wide band, narrow band, low boost or high boost response.

In the operation of the class B push-pull amplifier illustrated, one of the transistors **34*a* and 34*b* is activated on one-half of the drive cycle and the other conducts on the other half cycle. Both transistors are initially biased to cutoff, and just enough emitter current is allowed to flow to pass the transistor out of the high distortion region which occurs with very low signal drive from the output of the transistor amplifier 17**. By means of this invention the transistors may be biased further towards cutoff than was possible previously for a given distortion percentage and, therefore, the operating efficiently of the class B amplifier is increased.

The initial bias of the class B amplifier is established by the resistor-divider network effective from the collector of each of the transistors **34*a* and 34*b* to ground. Transistor 34*a* is biased by the resistor 42*a*, one-half of the resistance in the secondary winding 28 and the resistor 44. Transistor 34*b* is biased by the resistor 42*b*, the other one-half of the secondary winding 28 and the resistor 44. Since each transistor 34*a* and 34*b* is biased by separate collector-to-base resistors 42*a* and 42*b***, and since these resistors each have components of collector current and base current flowing through them, the resistors represent negative feedback which will reduce distortion.

In addition, the collector-to-base resistors **42*a* and 42*b* produce other important results. The input voltage applied across the secondary winding 28 of the transformer 26 alternately drives current through the base-emitter diode of transistor 34*a*, resistor 43 and resistor 44, and then through the base-emitter diode of transistor 34*b*, resistor 43 and resistor 44. The current flow through these loops causes a large collector-to-emitter current to flow through the resistor 43 and alternately through the transistor 34*a* and the transistor 34*b*. Because the resistor 43 is common to the current through the base-emitter loops and through the collector-emitter loops, there exists an upper limit to the allowable swing on the transistor bases. The lower the value of the resistor 43, the higher the absolute limit of the allowable swing. If we apply negative feedback we may drive the output to higher levels before the input swing exceeds the output maximum. Resistors 42*a* and 42*b* are employed for applying the required negative feedback. Thus, the resistors 42*a* and 42*b*** achieve three results: (1) they are part of the bias-establishing networks; (2) they reduce distortion through a negative feedback; and (3) they allow higher output power before diode distortion occurs by allowing the stage to adjust itself to high levels of drive.

As already pointed out, resistor 43 may be very low to raise the maximum allowable input and, in some cases, it is possible that it be eliminated. Resistor 44, as a result of values chosen for resistors **42*a* and 42*b***, must also be low and, therefore, these resistors represent low circuit loads and do not require by-passing. This is advantageous, since by-pass condensers would introduce time constants in the drive loops and would lower the maximum allowable input swing and defeat the floating nature of the operation.

From the foregoing it is seen that there has been provided an economical and efficient detector and an amplifier with sufficient gain, fidelity, quality and stability for use in commercial broadcast receivers. It is to be understood, however, that many modifications and adaptations of the various circuits and combinations of circuits may be made within the spirit of the invention. It is my intention that the described embodiments are merely illustrative of my invention, and that the invention be limited in use and scope only by the appended claims.

What is claimed is:

1. In a system for detecting and amplifying radio frequency currents amplitude-modulated with audio frequency signal, the combination comprising: a diode, an audio frequency load, and a direct current load series-connected across a source of radio frequency currents, the ratio of impedance of said audio frequency load to said direct current load being unity, said direct current load comprising first and second series-connected resistors, the junction between said resistors constituting a source of direct current power; a stable audio frequency amplifier including a transistor having a collector, an emitter, and a base, an input circuit being connected for audio frequency between said base and said emitter, and an output circuit being connected between said collector and said emitter, said output circuit including an audio frequency load and a first direct current load, a second direct current load in circuit with said emitter, and means for blocking the flow of direct current from said collector and said base except through said emitter and through said second direct current load; said input circuit including a fixed resistor having a movable tap; means coupling said audio frequency load to said input circuit, said means comprising a variable resistor connected in series with said movable tap; and means for simultaneously adjusting the impedance of said variable resistor as said movable tap is moved on said fixed resistor to maintain the total of the impedances constant, whereby said ratio of impedance of said alternating current load to said direct current load is maintained at unity.

2. In a system for detecting and amplifying radio frequency currents amplitude-modulated with audio frequency signals, the combination comprising: a diode, an audio frequency load, and a direct current load series-connected across a source of radio frequency currents, the ratio of impedance of said audio frequency load to said direct current load being unity, said direct current load comprising first and second series-connected resistors, the junction between said resistors constituting a source of direct current power; means for shunting alternating currents from said direct current load and means for shunting radio frequency currents from said audio frequency load; an audio frequency amplifier comprising a transistor; an input circuit connected for audio frequency currents across said audio frequency load of said detector, said input circuit including means for manually adjusting the gain of said transistor and for simultaneously adjusting the impedance of said alternating current load of said detector to maintain said ratio approximately at unity.

3. The invention as defined in claim 2 wherein said transistor is provided with an input, an output, and a common electrode and wherein said means for manually adjusting the gain of said transistor and for simultaneously adjusting the impedance of said alternating current load of said detector to maintain said ratio approximately at unity comprises a first resistor connected for audio frequencies across said input and common electrodes; a second resistor; movable taps for said first and second resistors, said movable taps being electrically interconnected and ganged for simultaneous movement, said audio frequency load and a portion of each of said first and second resistors being connected in a series loop through said movable taps, the portion of one of said resistors in said loop increasing as the portion of the other resistor in said loop decreases as said taps are simultaneously moved.

References Cited in the file of this patent

UNITED STATES PATENTS

| | | |
|---|---|---|
| 2,647,957 | Mallinckrodt | Aug. 4, 1953 |
| 2,750,456 | Waldhauer | June 12, 1956 |
| 2,760,007 | Lozier | Aug. 21, 1956 |
| 2,816,179 | Gittlemen et al. | Dec. 10, 1957 |
| 2,822,430 | Lin | Feb. 4, 1958 |
| 2,889,416 | Shea | June 2, 1959 |

(Other references on following page)

FOREIGN PATENTS

| | | |
|---|---|---|
| 398,882 | Great Britain | Sept. 25, 1933 |
| 756,017 | Great Britain | Aug. 29, 1956 |

OTHER REFERENCES

Article, "The Diode Detector" in Wireless World, Feb. 3, 1938, pages 103–105.

Sheehan et al.: "Design of High Gain Portable," Electronics, March 1955, pages 159–160.

Riddle: "High Fidelity Transistor Power Amplifier," Electronics, September 1955, page 174.

Tele-Tech, "1956 Transistor Portable Design," pages 100–102, April 1956.